(12) United States Patent
Lu et al.

(10) Patent No.: US 10,247,428 B2
(45) Date of Patent: Apr. 2, 2019

(54) DISC-TYPE AIR ECOSYSTEM BOX AND CLIMATIC ECOLOGIZED AIR-CONDITIONING METHOD THEREFOR

(71) Applicant: JIANGSU FENGSHEN AIR CONDITIONING GROUP CO., LTD., Nantong (CN)

(72) Inventors: Hui Lu, Nantong (CN); Huanqing Ding, Nantong (CN); Pengfeng Wei, Nantong (CN)

(73) Assignee: JIANGSU FENGSHEN AIR CONDITIONING GROUP CO., LTD., Nantong (CN)

( * ) Notice: Subject to any disclaimer, the term of this patent is extended or adjusted under 35 U.S.C. 154(b) by 0 days.

(21) Appl. No.: 15/600,738

(22) Filed: May 21, 2017

(65) Prior Publication Data

US 2017/0254549 A1   Sep. 7, 2017

Related U.S. Application Data

(63) Continuation of application No. PCT/CN2015/075929, filed on Apr. 3, 2015.

(30) Foreign Application Priority Data

Dec. 3, 2014  (CN) .......................... 2014 1 0718817

(51) Int. Cl.
| | |
|---|---|
| *H05K 7/20* | (2006.01) |
| *F24F 1/02* | (2019.01) |
| *F24F 13/28* | (2006.01) |
| *F24F 13/20* | (2006.01) |
| *F24F 3/044* | (2006.01) |

(Continued)

(52) U.S. Cl.
CPC ................ *F24F 1/02* (2013.01); *F24F 3/044* (2013.01); *F24F 3/1603* (2013.01); *F24F 11/30* (2018.01); *F24F 13/20* (2013.01); *F24F 13/28* (2013.01); *H05K 7/20* (2013.01); *F24F 2003/1667* (2013.01); *F24F 2013/202* (2013.01); *F24F 2013/205* (2013.01); *F24F 2221/36* (2013.01); *F24F 2221/54* (2013.01)

(58) Field of Classification Search
None
See application file for complete search history.

(56) References Cited

U.S. PATENT DOCUMENTS

| | | | | |
|---|---|---|---|---|
| 5,301,744 | A * | 4/1994 | Derks ..................... | F24F 13/20 165/137 |
| 8,790,451 | B1 * | 7/2014 | Narayanamurthy ........................ | B01D 53/261 62/271 |

(Continued)

*Primary Examiner* — Courtney Smith
(74) *Attorney, Agent, or Firm* — Hemisphere Law, PLLC; Zhigang Ma

(57) ABSTRACT

The present invention relates to a disc-type air ecosystem box. The disc-type air ecosystem box includes a housing, and the housing is provided to accommodate a power module, a health processing module, a summer load module, a winter comfort module, a safety module, and an air supply module. The health processing module, the summer load module, the winter comfort module, and the safety module are located on the periphery of the power module, and the air supply module is located behind the power module. The present invention further discloses an air-conditioning method for said disc-type air ecosystem box.

2 Claims, 2 Drawing Sheets

(51) Int. Cl.
*F24F 3/16* (2006.01)
*F24F 11/30* (2018.01)

(56) References Cited

U.S. PATENT DOCUMENTS

| | | | |
|---|---|---|---|
| 9,278,303 B1* | 3/2016 | Somani | B01D 47/06 |
| 2004/0094289 A1* | 5/2004 | Harshberger | F24F 1/027 |
| | | | 165/48.1 |
| 2004/0231512 A1* | 11/2004 | Slayzak | B01D 47/14 |
| | | | 95/211 |
| 2005/0252229 A1* | 11/2005 | Moratalla | B01D 53/26 |
| | | | 62/271 |
| 2009/0071327 A1* | 3/2009 | Latham | B01D 46/0023 |
| | | | 95/22 |
| 2010/0003164 A1* | 1/2010 | Bourne | A61L 9/205 |
| | | | 422/4 |

* cited by examiner

DISC-TYPE AIR ECOSYSTEM BOX AND CLIMATIC ECOLOGIZED AIR-CONDITIONING METHOD THEREFOR

CROSS-REFERENCE TO RELATED APPLICATION

This application claims priority to and benefits of Chinese Patent Application Serial No. CN201410718817.2, filed with the State Intellectual Property Office of P. R. China on Dec. 3, 2014, the entire contents of which are incorporated herein by reference.

TECHNICAL FIELD

The present disclosure relates to the field of an air handling unit technology, and particularly relates to a disc-type air ecosystem box and climatic ecologized air-conditioning method therefor.

BACKGROUND

An air handling unit is widely used in an all-air air conditioning system. According to statistics, almost 120 thousands air handling units of each type are needed in currently market, every year. Actually, one million air handling units are almost used.

A modular air-conditioning unit is the most important device of an air handling system. The modular air-conditioning unit at least includes several functions as bellow: transport, heating, cooling, humidification, dehumidification, filtration, sound absorption, and heat recollection. According to parameters of climate and air environment, each system is defined different functions. Functions of a traditional air handling unit are in series with each other, and the traditional air handling unit manufactures productions according to the functions and operating condition. Therefore, if the air handling unit has been completely assembled, functions thereof are substantially fixed.

Our environment goes from bad to worse, so the air handling unit is required to have more and more functions. Currently, the air handling unit almost is integrated many functions together, such as primary or/and middle-effect filter, surface cooling, heating, humidification, and sterilization, which needs more energy. In the other hand, efficient air handling units become more and more popular, because energy-saving is most important. Therefore, many companies, factories and institutes devoted in energy-saving technology, and they wants to use by-pass heating-cooling coils in transition seasons to save energy. However, using the by-pass heating-cooling coil increases material and space, which is not in conformity to the concept of go green, energy-saving, environmental awareness.

SUMMARY

The present disclosure aims to solve at least one of the above problems to some extent. Concretely, the present disclosure relates to a disc-type air ecosystem box having a reasonable structure and good performance, and together with a climatic ecologized air-conditioning method therefor.

A disc-type air ecosystem box, includes a housing, and the housing is provided to accommodate a power module, a health processing module, a summer load module, a winter comfort module, a safety module, and an air supply module. The health processing module, the summer load module, the winter comfort module, and the safety module are located on the periphery of the power module, the air supply module is located behind the power module. The power module comprises a flange of air inlet, paced on the housing. The power module comprises a casing paced behind the flange of air inlet. The casing is provided to accommodate an unhoused fan driven by a frequency conversion motor. A plate-type pre-filter is placed in front of the unhoused fan. The casing defines a first air dissipation, a second air dissipation, a third air dissipation, and a fourth air dissipation. The health processing module defines a first connecting air vent and a fourth connecting air vent, on opposite sides of the first air dissipation respectively. A first through vent is disposed between the first connecting air vent and the fourth connecting air vent. The health processing module further comprises an ultraviolet sterilizing device and a middle-effect electrostatic filter. The summer load module defines a first connecting air vent and a second connecting air vent, on opposite sides of the second air dissipation respectively. A second through vent is disposed between the first connecting air vent and the second connecting air vent. The summer load module further comprises a surface cooling coil and a thermotube reheat coil. The safety module defines a second connecting air vent and a third connecting air vent, on opposite sides of the third air dissipation respectively. A third through vent is disposed between the second connecting air vent and the third connecting air vent. The safety module defines further includes a PM2.5 filtering and detecting device. The winter comfort module defines a fourth connecting air vent and a third connecting air vent, on opposite sides of the fourth air dissipation respectively. A fourth through vent is disposed between the fourth connecting air vent and the third connecting air vent, and the winter comfort module further includes a heating coil and a humidifier.

An air-conditioning method for a disc-type air ecosystem box includes steps as bellow:

In transition seasons, during good air quality, the air flows into rooms, passing from the power module and the air supply module. The air current passes through an air inlet, the first air dissipation, the first through vent, and the air supply vent one by one, and all the other air vents are closed. During bad air quality, the air flows into rooms, passing from the power module, the health processing module, and the air supply module. The air current passes through the air inlet, the first air dissipation, the first connecting air vent, the second through vent, and the air supply vent one by one, and all the other air vents are closed. During worst air quality, the air flows into rooms, passing from the power module, the safety module, and the air supply module. The air current passes through the air inlet, the second air dissipation, the second connecting air vent, the fourth through vent, and the air supply vent one by one, and all the other air vents are closed.

In summer, during good air quality, the air flows into rooms, passing from the power module and the summer load module, and the air supply module. The air current passes through the air inlet, the second air dissipation, the second connecting air vent, the third through vent, and the air supply vent one by one, and all the other air vents are closed. During bad air quality, the air flows into rooms, passing from the power module, the health processing module, the summer load module, and the air supply module. The air current passes through the air inlet, the first air dissipation, the first connecting air vent, the second connecting air vent, the third through vent, and the air supply vent one by one, and all the other air vents are closed. During a smog, the air flows into rooms, passing from the power module, the health processing module, the summer load module, the safety module, and the air supply module. The air current passes through the air inlet, the first air dissipation, the first connecting air vent, the second connecting air vent, the third connecting air vent, the fourth through vent, and the air supply vent one by one, and all the other air vents are closed.

In winter, during good air quality, the air flows into rooms, passing from the power module, the winter comfort module, and the air supply module. The air current passes through the air inlet, the fourth air dissipation, the fourth connecting air vent, the first through vent, and the air supply vent one by one, and all the other air vents are closed. During bad air quality, the air flows into rooms, passing from the power module, the winter comfort module, the health processing module, and the air supply module. The air current passes through the air inlet, the fourth air dissipation, the fourth connecting air vent, the first connecting air vent, the second through vent, and the air supply vent one by one, and all the other air vents are closed. During worst air quality, the air flows into rooms, passing from the power module, the safety module, the winter comfort module, and the air supply module. The air current passes through the air inlet, the third air dissipation, the third connecting air vent, the fourth connecting air vent, the first through vent, and the air supply vent one by one, and all the other air vents are closed.

The disc-type air ecosystem box of this present disclosure has a reasonable structure and good performance. Each functions of the disc-type air ecosystem box are in parallel with each other, but functions of the traditional disc-type air ecosystem box are in series connection. Functions of the disc-type air ecosystem box are connected freely, and can't interfere in each other because of parallel connection.

The disc-type air ecosystem box saves space and energy. For example, a disc-type air ecosystem box with 10000 cm³/h processing power, includes functions as bellow: mix, primary filtration, electrostatic Filtration, surface cooling, heating, humidification, dehumidification, air supply, and PM2.5 filtering and detecting, but is only set in 3 m³ of land. To compare the traditional disc-type air ecosystem box, taken 9 m3 of land, the disc-type air ecosystem box saves 66 percent space. In the other hand, volume of the disc-type air ecosystem box is 30 m³, but volume of the traditional disc-type air ecosystem box is 37.2 m³. Therefore, the disc-type air ecosystem box consumes 24 percent less material than the traditional disc-type air ecosystem box.

The disc-type air ecosystem box saves energy. In transition seasons, the disc-type air ecosystem box consumes 43 percent less energy than the traditional disc-type air ecosystem box. In general, each year, the disc-type air ecosystem box consumes at least 30 percent less energy than the traditional disc-type air ecosystem box. In transition seasons, the disc-type air ecosystem box only be opened the air dissipation SIV to filter PM2.5 in the air outside, the disc-type air ecosystem box losses of pressure 150 Pa. Therefore, the disc-type air ecosystem box consumes about 2.5 kw, if blowing rate is 10000 cm³/h, excess pressure is 450 Pa, and total pressure of fan is 600 Pa. However, the traditional disc-type air ecosystem box must be opened all functions. In this way, the traditional disc-type air ecosystem box consumes about 2.5 kw, and total pressure of fan is 600 Pa. Therefore, in this condition, the disc-type air ecosystem box consumes 43 percent less energy than the traditional disc-type air ecosystem box. In summer, the disc-type air ecosystem box only be opened the air dissipation SI and the through vent PII, interior resistance of the disc-type air ecosystem box is 300 Pa, and total pressure of fan is 750 Pa. In this way, the disc-type air ecosystem box consumes about 3.0 kw, and consumes 32 percent less energy than the traditional disc-type air ecosystem box.

The disc-type air ecosystem box comprises an ecological monitor. If there is a change in the environmental climate and the air quality, the ecological monitor can detect, and then the disc-type air ecosystem box transforms to a corresponding module intelligently, for ensuring the ecological air quality.

The disc-type air ecosystem box comprises a safety module, for detecting hazard gas or biological ingredients in air. The safety module is provided to avoid polluting fresh air drain into rooms by hazard gas or biological ingredients in air, for ensuring the reliability of the disc-type air ecosystem box.

The disc-type air ecosystem box can be rotated 360° because of disk-type con-struction thereof. According to the requirement and actual assembly, the locate of tubes and wirings are adjusted conveniently by rotating 360°. Furthermore, the disc-type air ecosystem box is also convenient for assembly and service.

The summer load module comprises a thermotube reheat coil for supplying low temperature and humidity air, without another coil and consuming anther energy. Therefore, the disc-type air ecosystem box can ensure the thermal load, together with improving comfortable in rooms.

Additional aspects and advantages of the embodiments of the present disclosure will be given in part in the following descriptions, become apparent in part from the following descriptions, or be learned from the practice of the embodiments of the present disclosure.

Figure 1:
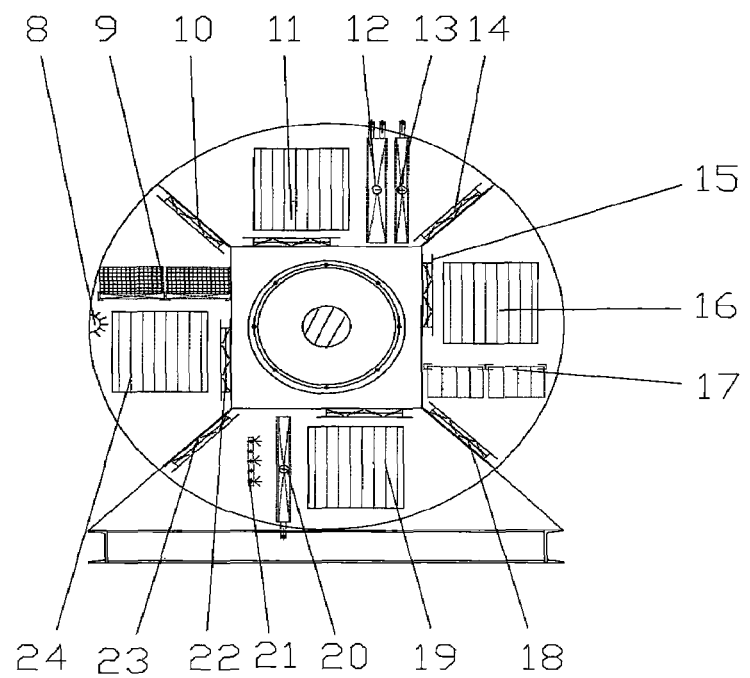
FIG. 1 is a structure view of a disc-type air ecosystem box and climatic ecologized air-conditioning method therefor in Example 1. The disc-type air ecosystem box includes a power module.
Figure 2:
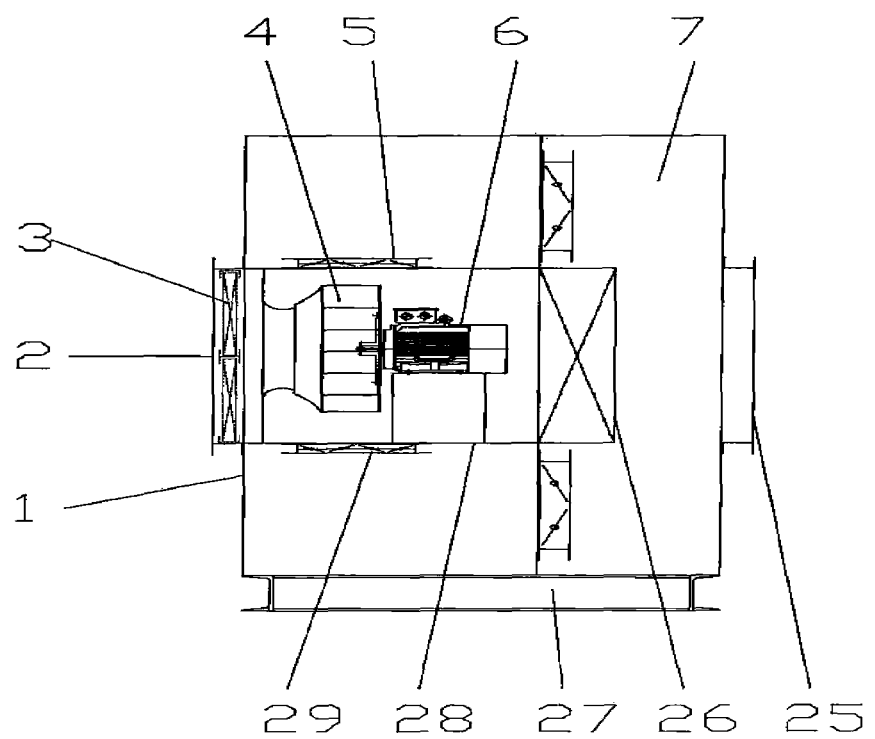
FIG. 2 is a structure view of the power module in the disc-type air ecosystem box.

The components and the labels thereof showed in the drawings are listed out as follows:

| | |
|---|---|
| 1—a housing; | 2—a flange of an air outlet; |
| 3—a plate-type pre-filter; | 4—an unhoused fan; |
| 5—a second air dissipation; | 6—a frequency conversion motor; |
| 7—an air supply plenum chamber; | 8—an ultraviolet sterilizing device; |
| 9—a middle-effect electrostatic filter; | 10—a first connecting air vent; |
| 11—a second through vent; | 12—a surface cooling coil; |
| 13—a thermotube reheat coil; | 14—a second connecting air vent; |
| 15—a third air dissipation; | 16—a third through vent; |
| 17—PM2.5 filtering and detecting device; | 18—a third connecting air vent; |
| 19—a fourth through vent; | 20—a heating coil; |
| 21—a humidifier; | 22—a first air dissipation; |
| 23—a fourth connecting air vent; | 24—a first through vent; |
| 25—a flange of air outlet; | 26—an ecological monitor; |
| 27—a chassis; | 28—a casing; |
| 29—a fourth air dissipation; | |

DETAILED DESCRIPTION

The disclosure is illustrated by way of example and not by way of limitation in the figures of the accompanying drawings in which like references indicate similar elements.

The present disclosure further discloses a disc-type air ecosystem box. The disc-type air ecosystem box includes a housing. The housing is provided to accommodate a power module, a health processing module, a summer load module, a winter comfort module, a safety module, and an air supply module. The health processing module, the summer load module, the winter comfort module, and the safety module are located on the periphery of the power module. The air supply module is located behind the power module.

The power module includes a flange of an air inlet, paced on the housing. The power module includes a casing paced behind the flange of air inlet. The casing is provided to accommodate an unhoused fan driven by a frequency conversion motor. A plate-type pre-filter is placed in front of the unhoused fan. The casing defines a first air dissipation, a second air dissipation, a third air dissipation, and a fourth air dissipation.

The health processing module defines a first connecting air vent and a fourth connecting air vent, on opposite sides of the first air dissipation respectively. A first through vent is disposed between the first connecting air vent and the fourth connecting air vent. The health processing module further includes an ultraviolet sterilizing device and a middle-effect electrostatic filter.

The summer load module defines a first connecting air vent and a second connecting air vent, on opposite sides of the second air dissipation respectively. A second through vent is disposed between the first connecting air vent and the second connecting air vent. The summer load module further includes a surface cooling coil and a thermotube reheat coil.

The safety module defines a second connecting air vent and a third connecting air vent, on opposite sides of the third air dissipation respectively. A third through vent is disposed between the second connecting air vent and the third connecting air vent. The safety module defines further includes PM2.5 filtering and detecting device.

The winter comfort module defines a fourth connecting air vent and a third connecting air vent, on opposite sides of the fourth air dissipation respectively. A fourth through vent is disposed between the fourth connecting air vent and the third connecting air vent. The winter comfort module further includes a heating coil and a humidifier.

The air supply module defines an air supply vent behind the housing, communicating with the first through vent, the second through vent, the third through vent, and the fourth through vent. The air supply module further includes an ecological monitor in front of the air supply vent.

The present disclosure further discloses an air-conditioning method for said disc-type air ecosystem box. The air-conditioning method is climatic ecologized and includes steps as bellow: In transition seasons, when air quality is good, the air flows into rooms, passing from the power module and the air supply module, and specifically, the air current passes through an air inlet, the first air dissipation, the first through vent, and the air supply vent one by one, with all the other air vents closed. When air quality is bad, the air flows into rooms, passing from the power module, the health processing module, and the air supply module, and specifically, the air current passes through the air inlet, the first air dissipation, the first connecting air vent, the second through vent, and the air supply vent one by one, with all the other air vents closed. When air quality is worst, the air flows into rooms, passing from the power module, the safety module, and the air supply module, and specifically, the air current passes through the air inlet, the third air dissipation, the third connecting air vent, the fourth through vent, and the air supply vent one by one, with all the other air vents closed.

In summer, when air quality is good, the air flows into rooms, passing from the power module and the summer load module, and the air supply module, and specifically, the air current passes through the air inlet, the second air dissipation, the second connecting air vent, the third through vent, and the air supply vent one by one, with all the other air vents closed. When air quality is bad, the air flows into rooms, passing from the power module, the health processing module, the summer load module, and the air supply module, and specifically, the air current passes through the air inlet, the first air dissipation, the first connecting air vent, the second connecting air vent, the third through vent, and the air supply vent one by one, with all the other air vents closed. During a smog, the air flows into rooms, passing from the power module, the health processing module, the summer load module, the safety module, and the air supply module, and specifically, the air current passes through the air inlet, the first air dissipation, the first connecting air vent, the second connecting air vent, the third connecting air vent, the fourth through vent, and the air supply vent one by one, with all the other air vents closed.

In winter, during good air quality, the air flows into rooms, passing from the power module, the winter comfort module, and the air supply module, and specifically, the air current passes through the air inlet, the fourth air dissipation, the fourth connecting air vent, the first through vent, and the air supply vent one by one, with all the other air vents closed. When air quality is bad, the air flows into rooms, passing from the power module, the winter comfort module, the health processing module, and the air supply module, and specifically, the air current passes through the air inlet, the fourth air dissipation, the fourth connecting air vent, the first connecting air vent, the second through vent, and the air supply vent one by one, with all the other air vents closed. When air quality is worst, the air flows into rooms, passing from the power module, the safety module, the winter comfort module, and the air supply module, and specifically, the air current passes through the air inlet, the third air dissipation, the third connecting air vent, the fourth connecting air vent, the first through vent, and the air supply vent one by one, with all the other air vents closed.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

The above embodiments are only illustrated to help understanding the method and the essential idea of the present invention. One of ordinary skill in the art can make other variations in the spirit of the present invention, these variations based upon the spirit of the present invention are all included in the claimed protect scope of the present invention. The above descriptions are only preferred embodiments, thus cannot limit the claim scope of the application. All the equivalent modifications and variations made by one of ordinary skill in the art based on the spirit of the present invention are belonged to the claim scope of the application.

What is claimed is:

1. A disc-type air ecosystem box characterized by comprising a housing, characterized in that the housing is provided to accommodate a power module, a health processing module, a summer load module, a winter comfort module, a safety module, and an air supply module;

the health processing module, the summer load module, the winter comfort module, and the safety module are located on the periphery of the power module, the air supply module is located behind the power module;

the power module comprises a flange of an air inlet, placed on the housing; the power module comprises a casing placed behind the flange of the air inlet; and the casing is provided to accommodate an unhoused fan driven by a frequency conversion motor; a plate-type pre-filter is placed in front of the unhoused fan; the casing defines a first air dissipator, a second air dissipator, a third air dissipator, and a fourth air dissipator;

the housing comprises a first connecting air vent, a second connecting air vent, a third connecting air vent, and a fourth connecting air vent; the first air dissipator is located between the first connecting air vent and the fourth connecting air vent, and a first through vent is disposed between the first connecting air vent and the fourth connecting air vent; the second air dissipator is located between the first connecting air vent and the second connecting air vent, and a second through vent is disposed between the first connecting air vent and the second connecting air vent; the third air dissipator is located between the second connecting air vent and the third connecting air vent, and a third through vent is disposed between the second connecting air vent and the third connecting air vent; the fourth air dissipator is located between the fourth connecting air vent and the third connecting air vent, and a fourth through vent is disposed between the fourth connecting air vent and the third connecting air vent;

the first connecting air vent, the fourth connecting air vent, and the first through vent belong to the health processing module; the health processing module further comprises an ultraviolet sterilizing device and a middle-effect electrostatic filter;

the first connecting air vent, the second connecting air vent, and the second through vent belong to the summer load module; the summer load module further comprises a surface cooling coil and a thermotube reheat coil;

the second connecting air vent, the third connecting air vent, and the third through vent belong to the safety module; the safety module defines further comprises PM2.5 filtering and detecting device;

the fourth connecting air vent, the third connecting air vent, and the fourth through vent belong to the winter comfort module; the winter comfort module further comprises a heating coil and a humidifier.

2. An air-conditioning method for the disc-type air ecosystem box of claim 1 characterized by comprising steps as bellow, characterized in that in transition seasons, during good air quality, the air flows into rooms, passing from the power module and the air supply module, the air current passes through an air inlet, the first air dissipator, the first through vent, and the air supply vent one by one, and all the other air vents are closed; during bad air quality, the air flows into rooms, passing from the power module, the health processing module, and the air supply module; the air current passes through the air inlet, the first air dissipator, the first connecting air vent, the second through vent, and the air supply vent one by one, and all the other air vents are closed; during worst air quality, the air flows into rooms, passing from the power module, the safety module, and the air supply module; the air current passes through the air inlet, the third air dissipator, the third connecting air vent, the fourth through vent, and the air supply vent one by one, and all the other air vents are closed;

in summer, during good air quality, the air flows into rooms, passing from the power module and the summer load module, and the air supply module; the air current passes through the air inlet, the second air dissipator, the second connecting air vent, the third through vent, and the air supply vent one by one, and all the other air vents are closed; during bad air quality, the air flows into rooms, passing from the power module ' the health processing module, the summer load module' and the air supply module; the air current passes through the air inlet, the first air dissipator, the first connecting air vent, the second connecting air vent, the third through vent, and the air supply vent one by one, and all the other air vents are closed; during a smog, the air flows into rooms, passing from the power module, the health processing module, the summer load module, the safety module, and the air supply module; the air current passes through the air inlet, the first air dissipator, the first connecting air vent, the second connecting air vent, the third connecting air vent, the fourth through vent, and the air supply vent one by one, and all the other air vents are closed;

in winter, during good air quality, the air flows into rooms, passing from the power module, the winter comfort module, and the air supply module; the air current passes through the air inlet, the fourth air dissipator, the fourth connecting air vent, the first through vent, and the air supply vent one by one, and all the other air vents are closed; during bad air quality, the air flows into rooms, passing from the power module, the winter comfort module, the health processing module, and the air supply module; the air current passes through the air inlet, the fourth air dissipator, the fourth connecting air vent, the first connecting air vent, the second through vent, and the air supply vent one by one, and all the other air vents are closed; during worst air quality, the air flows into rooms, passing from the power module, the safety module, the winter comfort module, and the air supply module; the air current passes through the air inlet, the third air dissipator, the third connecting air vent, the fourth connecting air vent, the first through vent, and the air supply vent one by one, and all the other air vents are closed.

* * * * *